United States Patent
Hiyama et al.

(10) Patent No.: US 7,456,882 B1
(45) Date of Patent: Nov. 25, 2008

(54) IMAGE PICKUP DEVICE

(75) Inventors: Hiroki Hiyama, Zama (JP); Shigetoshi Sugawa, Atsugi (JP); Isamu Ueno, Hadano (JP); Toru Koizumi, Yokohama (JP); Tetsunobu Kochi, Hiratsuka (JP); Katsuhito Sakurai, Machida (JP); Yuichiro Yamashita, Atsugi (JP); Tomoya Yoneda, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 1070 days.

(21) Appl. No.: 09/625,843

(22) Filed: Jul. 26, 2000

(30) Foreign Application Priority Data

Jul. 27, 1999 (JP) ................................. 11-212284

(51) Int. Cl.
*H04N 3/14* (2006.01)
*H04N 5/335* (2006.01)

(52) U.S. Cl. ..................................... 348/294

(58) Field of Classification Search ................. 348/302, 348/308, 241; 250/208.1; 257/291, 292
See application file for complete search history.

(56) References Cited

U.S. PATENT DOCUMENTS

| | | | |
|---|---|---|---|
| 4,835,404 A | 5/1989 | Sugawa et al. | 250/578 |
| 4,870,495 A * | 9/1989 | Kinoshita et al. | 348/264 |
| 4,879,470 A | 11/1989 | Sugawa et al. | 250/578 |
| 4,967,067 A | 10/1990 | Hashimoto et al. | 250/208.1 |
| 4,972,243 A | 11/1990 | Sugawa et al. | 357/30 |
| 5,162,912 A | 11/1992 | Ueno et al. | 358/213.16 |
| 5,184,006 A | 2/1993 | Ueno | 250/208.1 |
| RE34,309 E | 7/1993 | Tanaka et al. | 358/213.31 |
| 5,262,870 A | 11/1993 | Nakamura et al. | 358/212 |
| 5,539,196 A | 7/1996 | Miyawaki et al. | 250/208.1 |
| 5,693,932 A | 12/1997 | Ueno et al. | 250/208.1 |
| 5,714,752 A | 2/1998 | Ueno et al. | 250/208.1 |
| 5,949,483 A * | 9/1999 | Fossum et al. | 348/303 |
| 6,002,287 A | 12/1999 | Ueno et al. | 327/307 |
| 6,011,251 A * | 1/2000 | Dierickx et al. | 250/208.1 |
| 6,118,115 A | 9/2000 | Kozuka et al. | 250/208.1 |
| 6,538,693 B1* | 3/2003 | Kozuka | 348/241 |
| 6,791,612 B1* | 9/2004 | Hwang | 348/308 |
| 6,930,722 B1* | 8/2005 | Nakamura et al. | 348/362 |
| 6,963,372 B1* | 11/2005 | Hiyama et al. | 348/302 |

OTHER PUBLICATIONS

S.K. Mendis et al., "CMOS Active Pixel Image Sensors for Highly Integrated Imaging Systems", IEEE Journal of Solid State Circuits, vol. 32, No. 2, Feb. 1997.*
S.K. Mendis et al., "CMOS Active Pixel Image Sensors for Highly Integrated Imaging Systems", IEEE Journal Of Solid State Circuits, vol. 32, No. 2, Feb. 1997.

* cited by examiner

*Primary Examiner*—Lin Ye
*Assistant Examiner*—Yogesh Aggarwal
(74) *Attorney, Agent, or Firm*—Fitzpatrick, Cella, Harper & Scinto

(57) ABSTRACT

An image pickup device includes pixels each including a photoelectric conversion unit and a transfer switch for transferring a photoelectric conversion signal generated by the photoelectric conversion unit, and a driver for applying a pulse to the transfer switch a plurality of times when the signal generated by the photoelectric conversion unit is transferred via the transfer switch.

4 Claims, 6 Drawing Sheets

IMAGE PICKUP DEVICE

BACKGROUND OF THE INVENTION

1. Field of the Invention

The present invention relates to an image pickup device and drive method thereof.

2. Related Background Art

Research and development of an image sensor called a CMOS type image sensor which reads out a photoelectric conversion signal not with a CCD (charge coupled device) but with a MOS transistor, are becoming active nowadays.

This CMOS type image sensor is expected as an image sensor particularly for portable application because a CMOS logic LSI process can be used to fabricate the image sensor of such the type, a peripheral circuit can be integrated on a chip, and the CMOS type image sensor can be driven at a low voltage with a low power consumption. If a CMOS type image sensor is applied to technical fields requesting a high image quality, such as digital camera image pickup elements, it is necessary to provide some countermeasures against fixed pattern noises and random noises in order to obtain an image having a high S/N ratio.

As such countermeasures, a noise eliminating method has been proposed as disclosed, for example, in IEEE Journal of Solid-State Circuits, Vol. 32, No. 2, 1997 (drawings of FIG. 6 of this paper are shown in FIGS. 1A and 1B). In a circuit for reading out photoelectric conversion charges shown in FIG. 1A, light incident upon a photo-gate PG of a photoelectric conversion unit generates electric charges which are transferred from the photo-gate PG to an amplifier unit MIN via a transfer unit TX. The selection unit MX and a load current source MLN are activated to operate the amplifier unit MIN as a source follower. The charges amplified by the amplifier unit MIN are accumulated in capacitors CS and CR as photoelectric conversion charges and noise components immediately after resetting, respectively, and output as VOUTS and VOUTR.

The gate of the amplifier unit MIN has a floating diffusion FD gate region whose potential is reset by a reset unit MR to VDD when necessary. Switching transistors MSHS and MSHR are provided for transferring photoelectric conversion charges and noise components to the capacitors CS and CR respectively, during the operation of the source follower. Amplifier units MP1, MY1 and MLP1 output the amplified signal components VOUTS, and amplifier units MP2, MY2 and MLP2 output the amplified noise components VOUTR. The noise components VOUTR are thereafter subtracted from the signal components VOUTS to obtain the signal components from which the noise components are removed.

In this circuit constructed as above, as shown in FIG. 1B, after an input to the amplifier unit MIN is reset (after a gate signal R is changed to a low level), a gate signal SHR is applied to the gate of the switching transistor MSHR to turn on the switching transistor and read the noise components into the capacitor CR (during a period of a high level SHR). Thereafter, a low level signal is applied to the photo-gate PG which is a switch for controlling to transfer signal charges from the photodiode to the floating diffusion layer FD, and thereby charges remaining after the signal charges are read out to the FD are stored in the capacitor CS via the switching transistor MSHS. A difference (VOUTS−VOUTR) between two signals is finally output as the signal output.

A CMOS type image sensor is basically manufactured by CMOS logic processes and driven at a lower voltage than that of CCD. It is therefore difficult to form a sufficient potential gradient between the photodiode and charge accumulation region when the signal charges are transferred. Pixels unable to realize a sufficient transfer operation may be manufactured in some cases because of variation in manufacture processes. In such cases, fixed pattern noises (FPN) are generated because of variation in residual image characteristics of solid state image pickup elements. Irregularity of light output response characteristics is therefore a problem to be solved.

SUMMARY OF THE INVENTION

It is an object of the invention to reduce fixed pattern noises (FPN) caused by variation in residual image characteristics of solid state image pickup devices generated in manufacture processes, to thereby reduce irregularity of light output response characteristics.

In order to achieve the above object, according to an aspect of the present invention, there is provided an image pickup device comprising: pixels each including a photoelectric conversion unit and a transfer switch for transferring a photoelectric conversion signal generated by the photoelectric conversion unit; and driving means for applying a pulse to the transfer switch a plurality of times when the signal generated by the photoelectric conversion unit is transferred via the transfer switch.

According to an another aspect of the present invention, there is provided a driving method for an image pickup device having pixels each including a photoelectric conversion unit and a transfer switch for transferring a photoelectric conversion signal generated by the photoelectric conversion unit, comprising a step of applying a pulse to the transfer switch a plurality of times when the signal generated by the photoelectric conversion unit is transferred via the transfer switch.

Other objects and features of the invention will become more apparent from the following detailed description of embodiments when read in conjunction with the accompanying drawings.

DETAILED DESCRIPTION OF THE PREFERRED EMBODIMENTS

Hereinafter, preferred embodiments of the present invention will be described in detail with reference to the accompanying drawings.

Figure 1A:
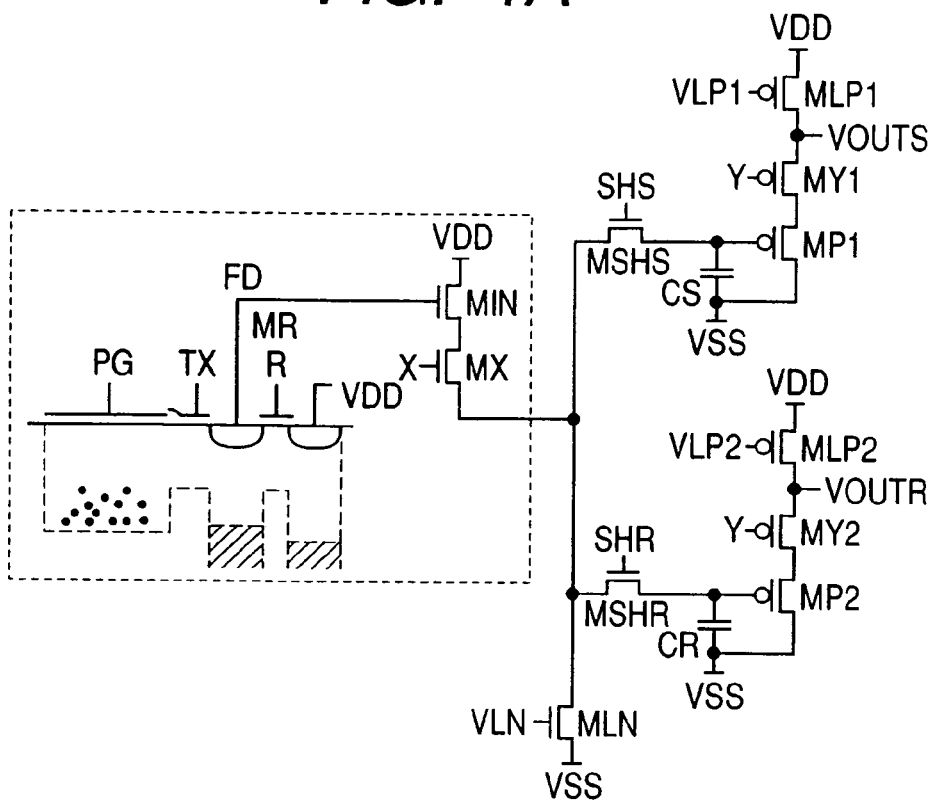
FIGS. 1A and 1B are diagrams showing a circuit structure of a conventional solid state image pickup device and its drive pulse timings.
Figure 1B:
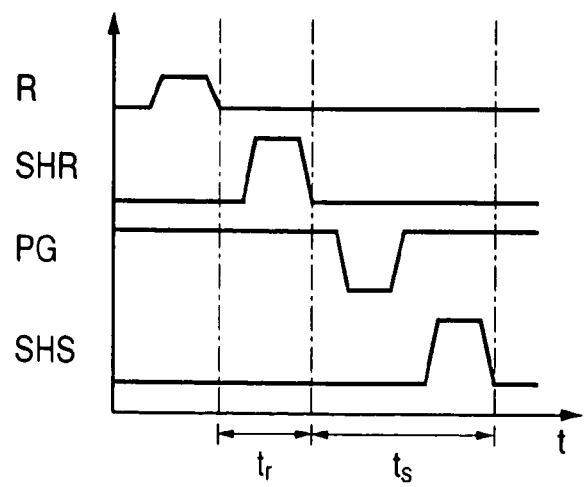
Figure 2:
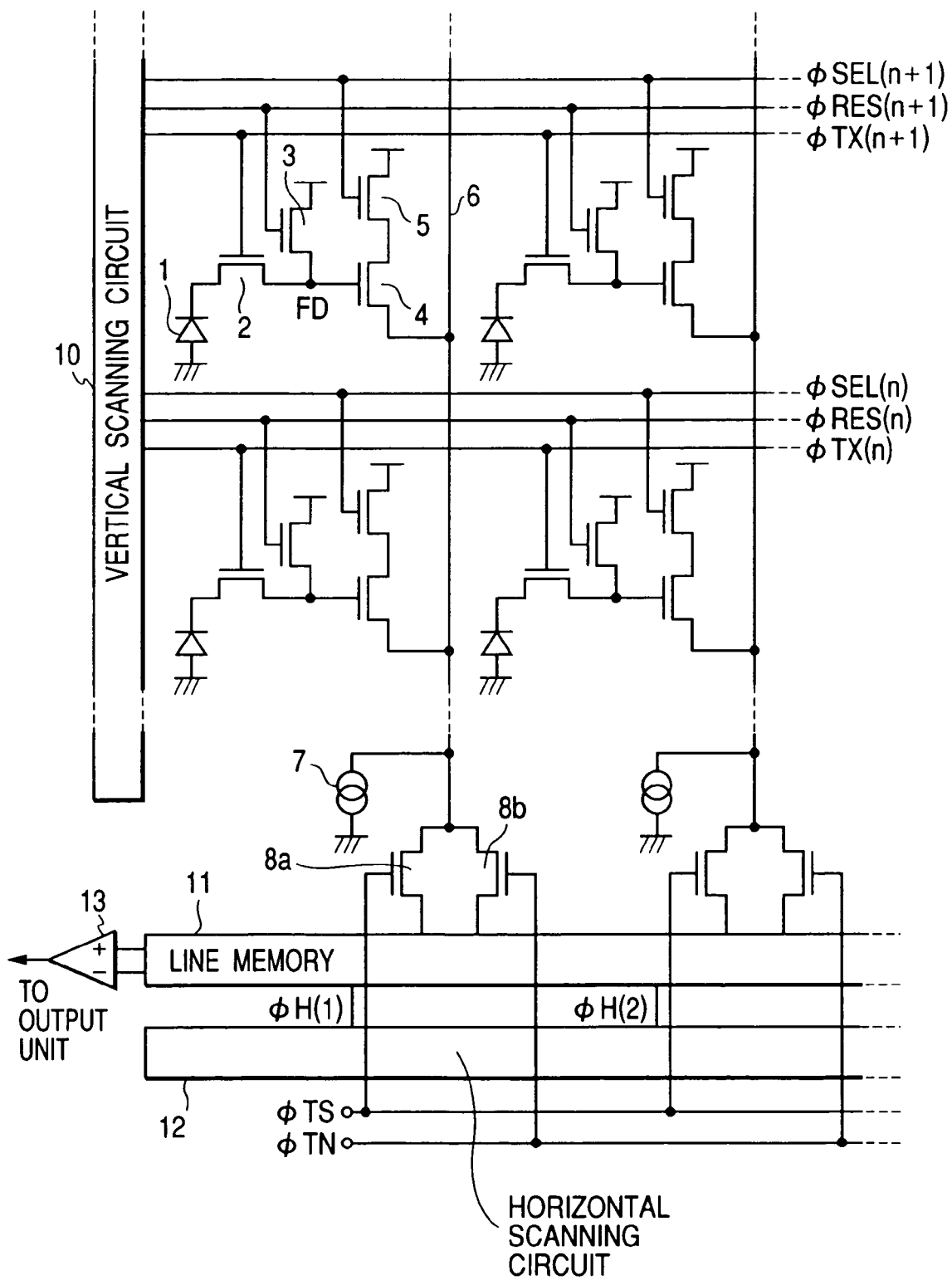
FIG. 2 is a schematic circuit diagram of a solid state image pickup device according to a first embodiment of the invention.

A first embodiment of the invention will be described with reference to the accompanying drawings. FIG. 2 is a schematic circuit diagram of a solid state image pickup device according to the first embodiment of the invention.

Each pixel has a photodiode 1 in a photoelectric conversion unit, a charge accumulation unit FD which is a floating diffusion gate, a transfer switch 2 which is a switch unit, a reset switch 3, a pixel amplifier 4 which is an amplifier unit, and a row select switch 5, which are interconnected as shown in FIG. 2. The charge accumulation unit FD converts light incident upon the photodiode 1 into photoelectric conversion charge signals and accumulates these charge signals. The transfer switch 2 controls a charge transfer from the photoelectric conversion unit to the charge accumulation unit FD. The reset switch 3 resets the potential at the floating diffusion gate to a power source voltage. The pixel amplifier 4 is applied with the potential at the charge accumulation unit FD as its gate input. The row select switch 5 selects a row upon reception of a row select pulse φSEL.

Sequentially responding to the select pulse φSEL, a control pulse φTX and a reset pulse φRES, photoelectric conversion charges are read from each pixel to a vertical output line 6. Sequentially responding to a control signal and transfer pulses φTS and φTN supplied from a horizontal scanning circuit 12, noise components and signal components are stored in a line memory 11 and a difference between the noise and signal components is output.

In the circuit shown in FIG. 2, when the row select switch 5 is turned on upon reception of the select pulse φSEL, a source follower circuit constituted of a load current source 7 and the pixel amplifier 4 becomes active, so that outputs of the selected row are transferred to a vertical output line 6 and stored via transfer gates 8a and 8b into the line memory 11. The outputs temporarily stored in the line memory 11 are sequentially read out to an output unit under the control of the horizontal scanning circuit 12.

Figure 3:
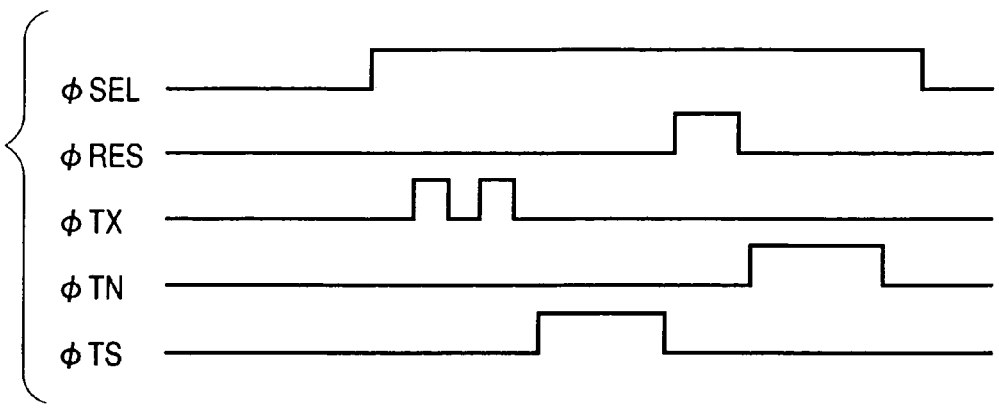
FIG. 3 is a timing chart of drive pulses used by the image pickup device of the first embodiment.

When the solid state image pickup device is driven by drive pulses shown in the timing chart of FIG. 3, it operates in the following manner. First, a vertical scanning circuit 10 supplies the select pulse φSEL of a high level when any one of rows is selected, and thereby the source follower circuit of this row is turned on. Thereafter, the control pulse φTX of a high level is supplied to the transfer switch 2 intermittently a plurality of times. Although the number of high level pulses is two as illustrated in FIG. 3, it is not limited only thereto but it may be increased more. Signal charges can therefore be transferred quickly from the photodiode 1 to the floating diffusion layer FD. Next, the control pulse φTS of a high level is supplied to the transfer gate 8a to store the photoelectric conversion output into the line memory 11. Thereafter, the reset pulse φRES is applied to reset the potential at the floating diffusion layer FD of the pixel amplifier 4, and the reset output of the pixel is stored in an another line memory 11 as a base noise after resetting. The reset output is subtracted from the photoelectric conversion charge output by a differential amplifier 13 so that fixed pattern noises caused by variation in pixel element characteristics can be eliminated.

Figure 4A:
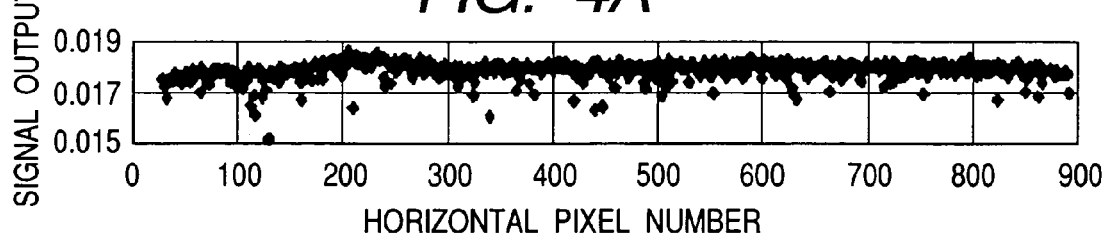
FIGS. 4A, 4B and 4C are diagrams showing outputs of the solid state image pickup device of the first embodiment driven by different methods.
Figure 4B:
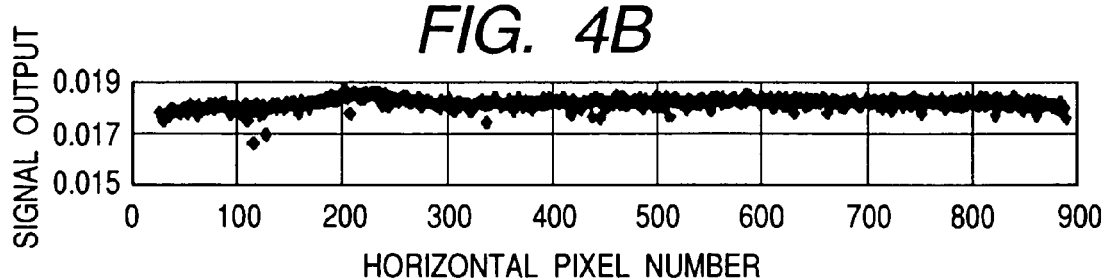
Figure 4C:
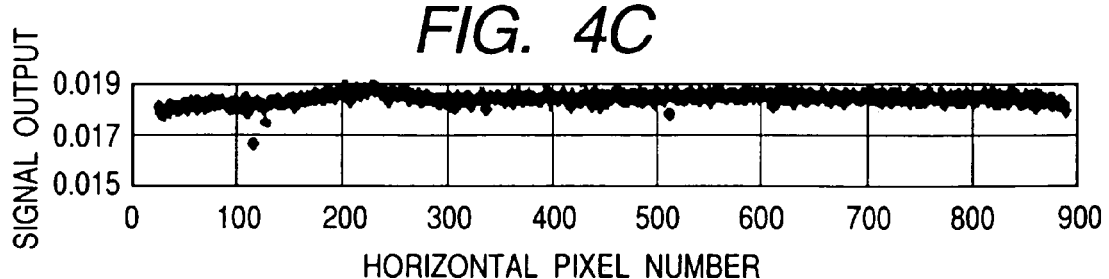

In FIGS. 4A to 4C, the abscissa represents the number of horizontal pixels and the ordinate represents the signal output level of each pixel. FIG. 4A shows the pixel output level when the transfer pulse φTX is applied once, FIG. 4B shows the pixel output level when the transfer pulse φTX is applied twice, and FIG. 4C shows the pixel output level when the transfer pulse φTX is applied three times. The high level of the transfer pulse φTX was set to 3 V. FIGS. 4A to 4C show a change in an output signal level with the number of transfer pulses φTX of the high level. It can be understood from FIGS. 4A to 4C that irregularity of the bright signal outputs is improved as the number of transfer pulses φTX of the high level is increased. According to the experiments made by the inventors of the present invention, it has been confirmed that irregularity of the bright signal outputs is improved by applying a plurality of transfer pulses φTX more than by applying a single transfer pulse, even if the period of the high level of the pulses are the same in the both cases.

Figure 5:
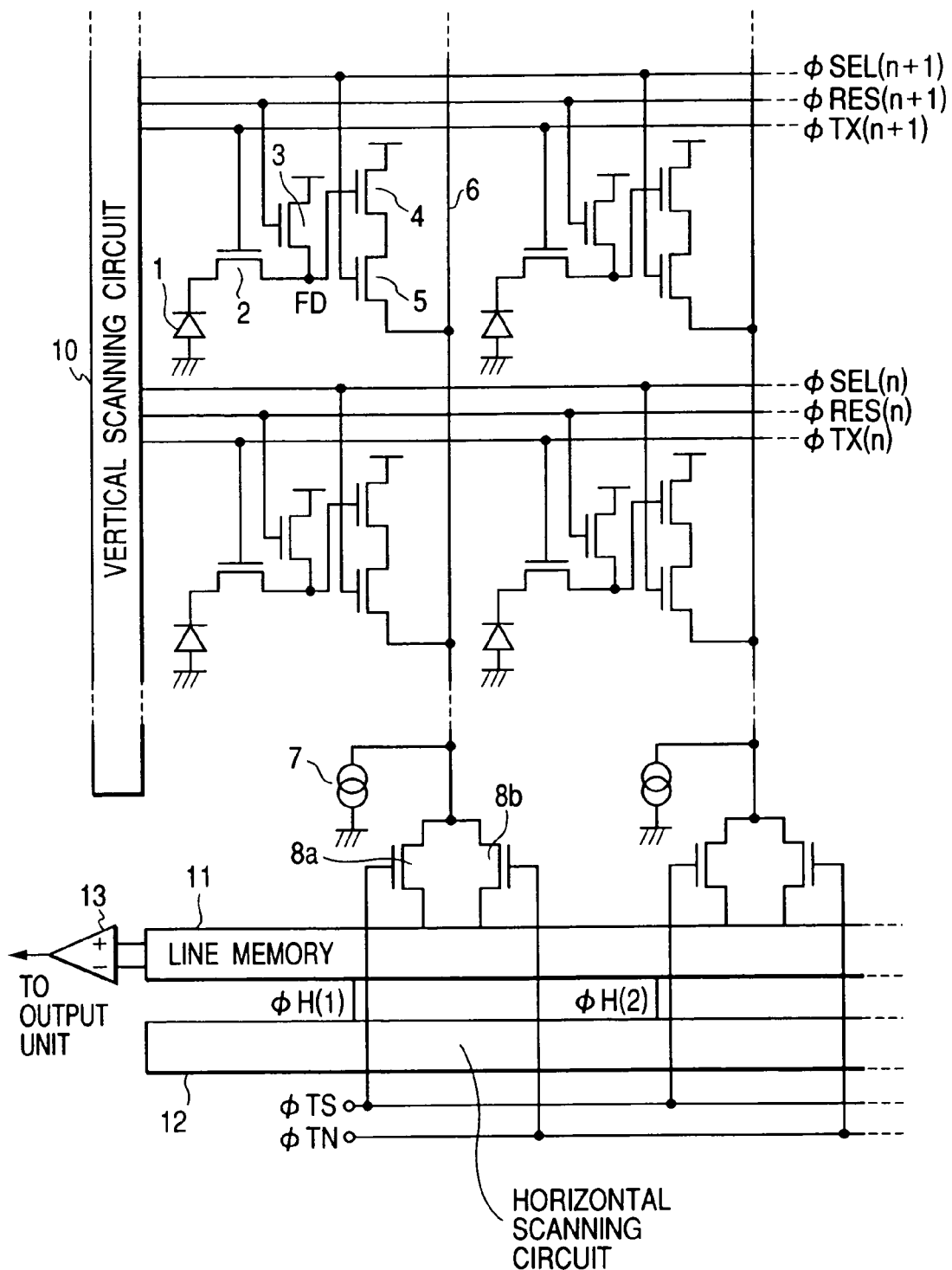
FIG. 5 is a schematic circuit diagram of a solid state image pickup device according to a second embodiment of the invention.
Figure 6:
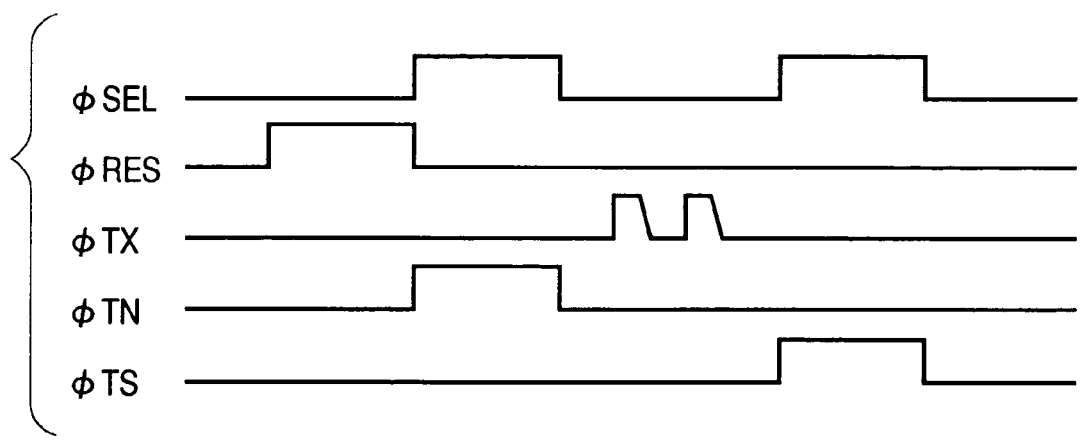
FIG. 6 is a timing chart of drive pulses used by the image pickup device of the second embodiment.

In the second embodiment of the invention, a solid state image pickup device shown in FIG. 5 is driven by drive pulses shown in FIG. 6.

Referring to FIG. 5, each pixel has a photodiode 1, a transfer switch 2, a reset switch 3, a pixel amplifier 4 and a row select switch 5. The second embodiment is different from the first embodiment in that the row select switch 5 is provided on the side of a vertical output line 6 to which photoelectric conversion charges are output from the pixel amplifier 4.

In the circuit shown in FIG. 5, when the row select switch 5 is turned on upon reception of the select pulse φSEL, a source follower circuit constituted of a load current source 7 and the pixel amplifier 4 becomes active, so that outputs of the selected row are transferred to a vertical output line 6 and stored via transfer gates 8a and 8b into a line memory 11. The outputs temporarily stored in the line memory 11 are sequentially read out to an output unit under the control of a horizontal scanning circuit 12.

An operation of the second embodiment is different from the first embodiment in that the pixel amplifier 4 has a broader operation range and thereby obtaining a broad dynamic range of a pixel output. Even at a power source voltage lower than the first embodiment, a pixel output of a high level can be obtained compared with the first embodiment.

FIG. 6 is a timing chart of drive signals illustrating the operation of the solid state image pickup device shown in FIG. 5. First, a vertical scanning circuit 10 supplies a reset pulse φRES of a high level to reset the potential at the floating diffusion gate layer FD between the transfer switch 2 and pixel amplifier 4, to a difference voltage between the gate voltage of the reset switch 3 and its threshold value voltage. Next, the select pulse φSEL of a high level is applied to activate the source follower. At the same time, a transfer pulse φTX of a high level is applied to a transfer gate 8b to store the reset output of the pixel in the line memory 11 as a base noise level after resetting. Thereafter, a control pulse φTX of a high level is supplied to the transfer switch 2 intermittently a plurality of times. Although the number of high level pulses is two as illustrated in FIG. 6, it may be increased more unless there are particular restrictions. Signal charges can therefore be transferred quickly from the photodiode 1 to the floating diffusion gate layer FD.

Subsequently, at the same time when the select pulse φSEL of the high level is applied, a control pulse φTS of a high level is applied to a transfer gate 8a to store a photoelectric conversion charge signal from the pixel into the line memory 11. The reset output is subtracted from the photoelectric conversion charge output by a differential amplifier 13 so that fixed pattern noises caused by variation in pixel element characteristics can be eliminated. Thereafter, the vertical scanning circuit 10 selects the next pixel row and applies the reset pulse φRES of the high level to sequentially obtain the pixel output.

In this embodiment, the order of reading the photoelectric conversion charge output and reset output is reversed from that of the first embodiment in order to calculate a difference between correlated signals and reduce the reset output noises. In a moving picture output operation of a solid state image pickup device using a method of reading correlated signals as in this embodiment, a period of transferring signal charges by applying a transfer pulse is generally in the order of several microseconds. However, with the driving method of the present invention, charges can be transferred quickly in a limited transfer period.

The falling edge of the transfer pulse φTX is slanted to prevent charges from being returned to the photodiode when the transfer switch is turned off. Accordingly, in this embodiment, a photoelectric conversion charge signal of good noise characteristics from which not only fixed pattern noises but also random noises are reduced, can be obtained.

As described above, according to the first and second embodiments, a signal transfer efficiency of a photodiode can be improved and a photoelectric conversion charge output having good noise characteristics can be obtained. Particularly, low power consumption and high image quality can be achieved by manufacturing solid state image pickup devices by using CMOS logic LSI processes. In the embodiments, the waveform of a pulse to be applied to each switching element is rectangular and triangular. The invention is not limited only to those pulse waveforms. The application field of the invention is not limited only to CMOS type image sensors, but the invention is applicable to general solid state image pickup devices.

A third embodiment will be detailed with reference to FIG. 7, the third embodiment applying the solid state image pickup device of the first or second embodiment to an image pickup system such as a still image camera.

Figure 7:
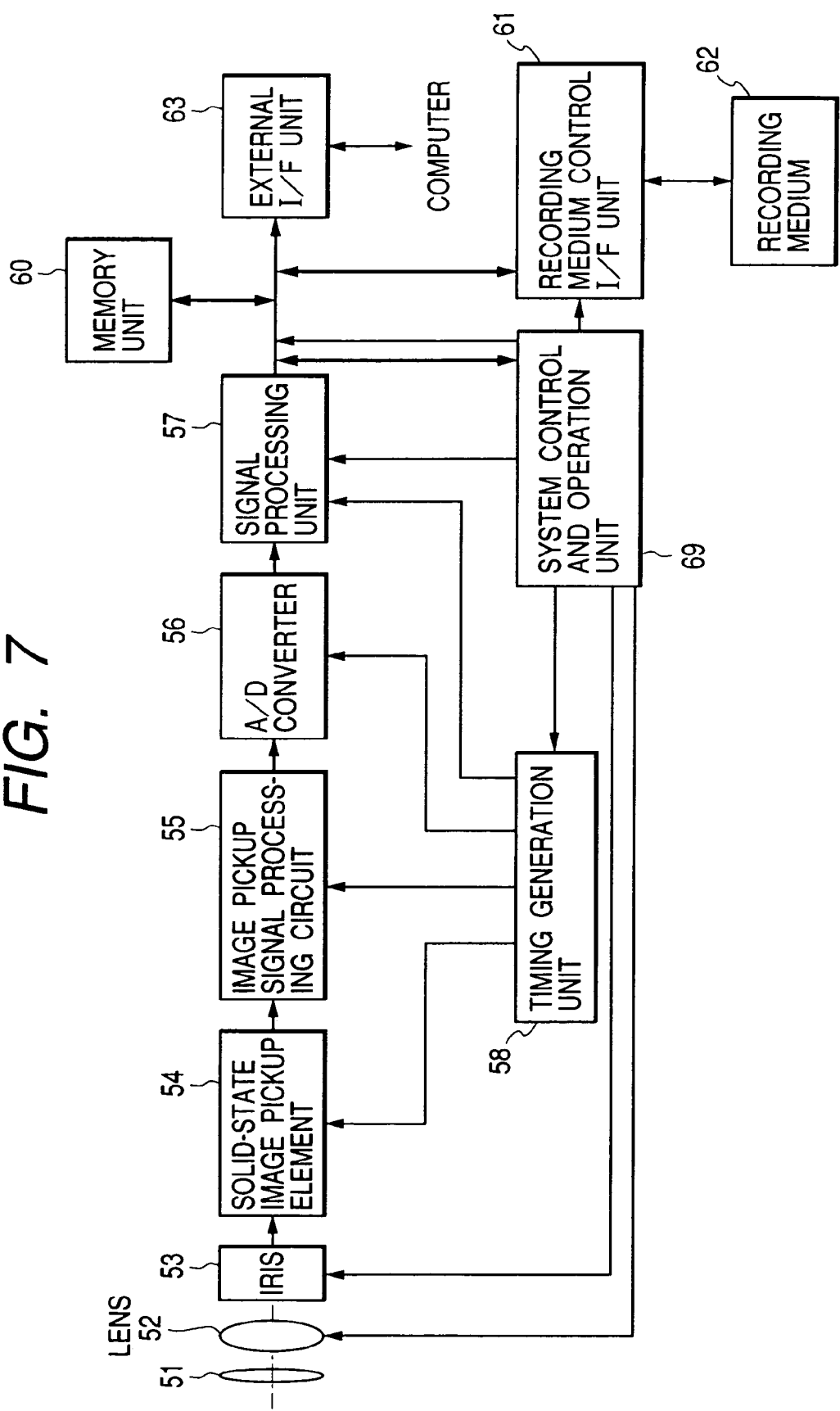
FIG. 7 is a block diagram showing an image pickup system according to a third embodiment, this system using the solid state image pickup device of the first or second embodiment.

In FIG. 7, a barrier 51 is used as a protector for a lens 52 and as a main switch for the image pickup system. The lens 52 focusses an optical image of an object onto a solid state image pickup device 54. An iris 53 changes the amount of light passing through the lens 52. The solid state image pickup device 54 picks up the object image focussed by the lens 52 as an image signal and may be the solid state image pickup device of either the first embodiment or the second embodiment. An image pickup signal processing circuit 55 processes the image pickup signal output from the solid image pickup device 54. An A/D converter 56 converts an analog image signal output from the solid state image pickup device 54 into a digital image signal. A signal processing unit 57 performs various correction operations and a compression operation on the image data output from the A/D converter 56. A timing generation unit 58 supplies various timing signals to the solid state image pickup device 54, image pickup signal processing circuit 55, A/D converter 56, and signal processing unit 57. A system control and operation unit 59 performs various operations to control the whole of the image pickup system. A memory unit 60 temporarily stores image data. An interface (I/F) unit 61 is used for data transfer to and from a recording medium 62. The recording medium 62 is a removable recording medium such as a semiconductor memory for image data read/write. An interface unit 63 is used for communications with an external computer or the like.

Next, the image pickup operation of the image pickup system constructed as above will be described.

When the barrier 51 is opened, a main power source is turned on, then a control system power source is turned on, and further an image pickup system power source for the A/D converter 56 and the like is turned on. In order to control the exposure amount, the system control and operation unit 59 opens the iris 53. A signal output from the solid state image pickup device 54 is converted by the A/D converter 56 and then input to the signal processing unit 57.

In accordance with the output data of the signal processing unit 57, the system control and operation unit 59 calculates an exposure amount. A brightness is judged from this photometry and the system control and operation unit 59 controls the iris 52.

Next, in accordance with the signal output from the solid state image pickup device 54, the system control and operation unit 59 extracts the high frequency components of the signal and calculates a distance to the object. Thereafter, the lens is driven and it is judged whether an in-focus is obtained. If it is judged that an in-focus is not obtained, the lens is again driven to perform range finding. After the in-focus is established, a main exposure is performed.

After the main exposure, the image signal output from the solid state image pickup device 54 is A/D converted by the A/D converter 56, and written in the memory unit 60 via the signal processing unit 57 under the control of the system control and operation unit 59.

The data stored in the memory unit 60 is recorded in the removable recording medium 62 such as a semiconductor memory via the interface unit 61 under the control of the system control and operation unit 59. Image data may be input directly to a computer or the like via the external interface unit 63 and processed by the computer or the like.

The solid state image pickup device 54, image pickup signal processing unit 55, A/D converter 56, signal processing unit 57, timing generation unit 58, system control and operation unit 59, memory unit 60 and the like may be formed as separete semiconductor chips or as a single semiconductor chip manufactured by, for example, CMOS logic LSI processes.

Many widely different embodiments of the present invention may be constructed without departing from the spirit and scope of the present invention. It should be understood that the present invention is not limited to the specific embodiments described in the specification, except as defined in the appended claims.

What is claimed is:

1. A driving method for a CMOS type image pickup device having pixels each including a photoelectric conversion unit and a transfer MOS transistor for transferring photoelectric conversion signal charges generated by the photoelectric conversion unit to a floating diffusion region at an input terminal of an amplifier element, wherein the image pickup device includes signal lines configured to output an amplified signal to a capacitor arranged at each signal line, the driving method comprising, for a pixel:
   a driving step comprising at least a first and a second transfer step, the first transfer step being performed for applying a pulse to a transfer switch to transfer a part of signal charges generated during one accumulation period by a photoelectric conversion unit to a floating diffusion region, and the second transfer step being performed, subsequently to the first transfer step, for applying a pulse to the transfer switch to transfer a remaining part of the signal charges generated during the same one accumulation period by the photoelectric conversion unit to the floating diffusion region, before reading out a signal from the pixel to a corresponding signal line,
   wherein no reset of the floating diffusion region is performed between the first and second transfer steps of the signal charges.

2. The driving method according to claim 1,
   wherein the driving step includes a step of resetting an input terminal of an amplifier element and outputting a reset signal generated from the amplifier element upon the resetting, and a step of outputting a photoelectric conversion signal from the amplifier element, and
   wherein the driving method further comprises a step of subtracting the reset signal from the photoelectric conversion signal.

3. The driving method according to claim 1, wherein the photoelectric conversion signal and the reset signal include correlated signals.

4. A driving method for a CMOS type image pickup device having pixels each including a photoelectric conversion unit and a transfer MOS transistor for transferring photoelectric conversion signal charges generated by the photoelectric conversion unit to a floating diffusion region at an input terminal of an amplifier element, wherein the image pickup device includes signal lines configured to output the amplified signal to a capacitor arranged at each signal line, the driving method comprising, for a pixel:

a driving step comprising at least a first and a second transfer step, the first transfer step being performed for applying a pulse to a transfer switch to transfer an already accumulated substantial part of signal charges generated during one accumulation period by a photoelectric conversion unit to a floating diffusion region, and the second transfer step being performed, subsequently to the first transfer step, for applying a pulse to the transfer switch to transfer a remaining part of the signal charges generated during the same one accumulation period by the photoelectric conversion unit to the floating diffusion region, before reading out a signal from the pixel to a corresponding signal line, wherein no reset of the floating diffusion region is performed between the first and second transfer steps of the signal charges, and, during a time period between the first and second transfer steps, there is no effective quantity of light incident on the photoelectric conversion unit.

* * * * *